(12) United States Patent
Suzuki et al.

(10) Patent No.: US 6,882,172 B1
(45) Date of Patent: Apr. 19, 2005

(54) SYSTEM AND METHOD FOR MEASURING TRANSISTOR LEAKAGE CURRENT WITH A RING OSCILLATOR

(75) Inventors: Shingo Suzuki, San Jose, CA (US); James Burr, Foster City, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 10/124,152

(22) Filed: Apr. 16, 2002

(51) Int. Cl.[7] .............................................. G01R 31/26
(52) U.S. Cl. ...................................... 324/769; 324/765
(58) Field of Search ............................... 324/760–765; 368/203–205; 331/57, 65, 183

(56) References Cited

U.S. PATENT DOCUMENTS

| | | | | |
|---|---|---|---|---|
| 5,410,278 A | * | 4/1995 | Itoh et al. ...................... | 331/57 |
| 5,568,103 A | * | 10/1996 | Nakashima et al. ........... | 331/57 |
| 5,594,360 A | * | 1/1997 | Wojciechowski ............ | 324/765 |
| 5,680,359 A | * | 10/1997 | Jeong .......................... | 365/211 |
| 5,764,110 A | * | 6/1998 | Ishibashi ...................... | 331/57 |
| 5,796,313 A | * | 8/1998 | Eitan ............................ | 331/57 |
| 5,977,763 A | * | 11/1999 | Loughmiller et al. ........ | 324/763 |
| 6,172,943 B1 | * | 1/2001 | Yuzuki ........................ | 368/204 |
| 6,229,747 B1 | * | 5/2001 | Cho et al. .................... | 365/222 |
| 6,242,936 B1 | * | 6/2001 | Ho et al. ...................... | 324/765 |
| 6,489,796 B1 | * | 12/2002 | Tomishima .................. | 324/763 |

* cited by examiner

*Primary Examiner*—David Zarneke
*Assistant Examiner*—Jermele Hollington
(74) *Attorney, Agent, or Firm*—Wagner, Murabito, & Hao LLP

(57) ABSTRACT

A method of measuring the transistor leakage current. In one embodiment, the method involves driving a ring oscillator with a dynamic node driver having a leakage test device biased to an off state to produce a test signal. The test signal is extracted and the frequency is measured. The leakage current is estimated from the measured frequency.

7 Claims, 18 Drawing Sheets under test that is biased to an off state. A signal

SYSTEM AND METHOD FOR MEASURING TRANSISTOR LEAKAGE CURRENT WITH A RING OSCILLATOR

TECHNICAL FIELD

Embodiments of the present invention relate to the field of semi-conductor circuits. More specifically, embodiments of the present invention relate to the field of ring oscillators for measuring characteristics of a semi-conductor device.

BACKGROUND ART

One of the challenges facing the users and designers of integrated circuits is managing the power produced by a chip. The power dissipated by a digital chip has two basic sources which are switching current and leakage current. When a gate is switching from one logical value to another, there is a brief period time where current passes through the transistors dissipating power in the form of heat. Historically, this switching current has been the focus of the designer's attention because it was substantially greater than the nominal leakage current that occurred when the gate was not switching and the transistors were "off".

However, with smaller geometries and reduced operating voltages, the leakage current is a significantly larger proportion of the power production problem. Thus, chip designers need to develop both on and off chip techniques for dealing with leakage current. One of the challenges is accurately measuring the amount of leakage current that is actually present on a particular chip.

SUMMARY OF THE INVENTION

Accordingly, what is needed is a system and method for accurately measuring the leakage current of a typical device on a chip. Embodiments of the present invention are directed toward a system and method for accurately measuring the leakage current of one or more transistors on a chip. Specifically, a ring oscillator with a frequency directly related to the leakage current is described herein.

In one embodiment of the present invention, a signal generation circuit is described. The signal generation circuit has a dynamic node driver with a pre-charge device and a leakage test device that is biased to an off state, a differential amplifier coupled to the dynamic node driver and to a delay unit. The delay unit drives the pre-charge device.

In another embodiment of the present invention, a signal generation circuit is described with a pre-charge device and a leakage test device that may be biased to an off state forming a dynamic node driver. The dynamic node driver drives a test delay unit that may drive the pre-charge device.

In another embodiment of the present invention, a signal generation circuit comprising a test oscillator with a dynamic node driver and a test loop delay and are reference oscillator with a reference loop delay is described. The dynamic node driver has a leakage test device that is biased to an off state. The reference loop delay can be comparable to the test loop delay.

In one embodiment of the present invention, a method of generating a signal with a frequency related to leakage current is further presented. The method involves driving a ring oscillator with a dynamic node driver. The dynamic node driver may have a pre-charge device and a leakage test device biased to an off state.

In another embodiment of the present invention, a method of measuring the leakage current is described. The method involves driving a ring oscillator with a dynamic node driver having a leakage test device biased to an off state to produce a test signal. The test signal is extracted and the frequency is measured. The leakage current is estimated from the measured frequency.

These and other advantages of the present invention will no doubt become obvious to those of ordinary skill in the art after having read the following detailed description of the preferred embodiment that are illustrated in the drawing figures.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE INVENTION

Reference will now be made in detail to the present embodiments of the invention, examples of which are illustrated in the accompanying drawings. While the invention will be described in conjunction with the present embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description, for purposes of explanation, numerous specific details are set forth in order to provide a thorough understanding of the present invention. It will be apparent, however, to one skilled in the art, upon reading this disclosure, that the present invention may be practiced without these specific details. In other instances, well-known structures and devices are not described in detail in order to avoid obscuring aspects of the present invention.

Figure 1:
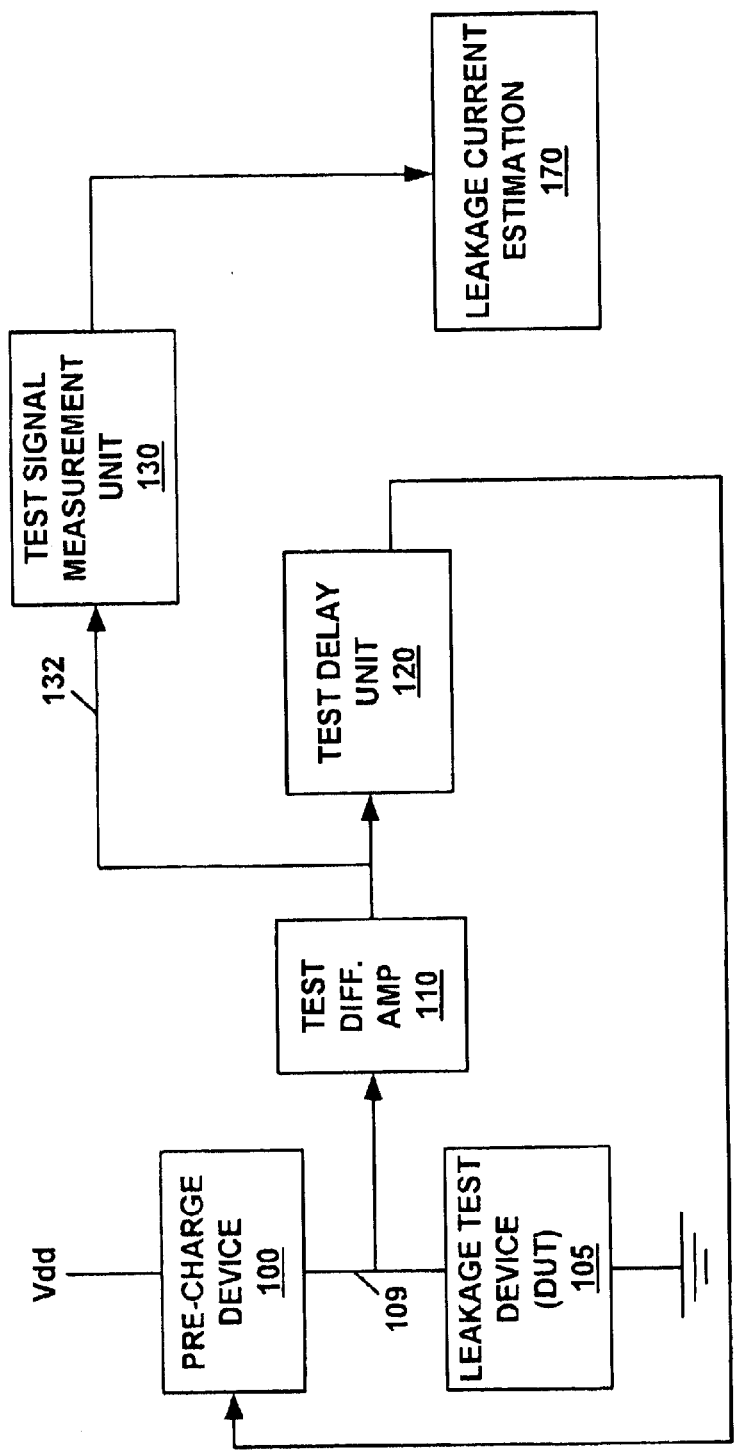
FIG. 1 is a block diagram of a leakage current measurement system in accordance with an embodiment of the present invention.

FIG. 1 shows a block diagram of an exemplary embodiment of the present invention. One exemplary structure is a ring oscillator composed of a pre-charge device 100, a leakage test device 105, a differential amplifier 110, and a delay unit 120. The leakage test device 105 is also known as the device under test (DUT). It is biased to the off-state. The leakage test device 105 and the pre-charge device together form a dynamic node driver. When the pre-charge device 100 is turned on, it brings the dynamic node 109 up to voltage $V_{dd}$. When the pre-charge device 100 is turned off, the leakage test device 105 lets the charge accumulated at the dynamic node 109 bleed off. The resulting ring oscillator generates a periodic signal with a frequency that is directly related to the leakage current—a high leakage current results in a high frequency while a low leakage current results in a relatively low frequency. The delay unit 120 in combination with the differential amplifier 110 and the pre-charge device 100 must present an odd number of inversions around the loop.

The periodic signal is tapped at test signal node 132. The test signal measurement unit 130 conditions the test signal at the test signal node 132 by running it through one or more flip-flops (or comparable numbers of latches) as well as measuring the fundamental frequency of the test signal. The leakage current estimation unit 170 performs a calculation on the measured frequency to estimate the leakage current in the leakage test device 105.

Figure 2:
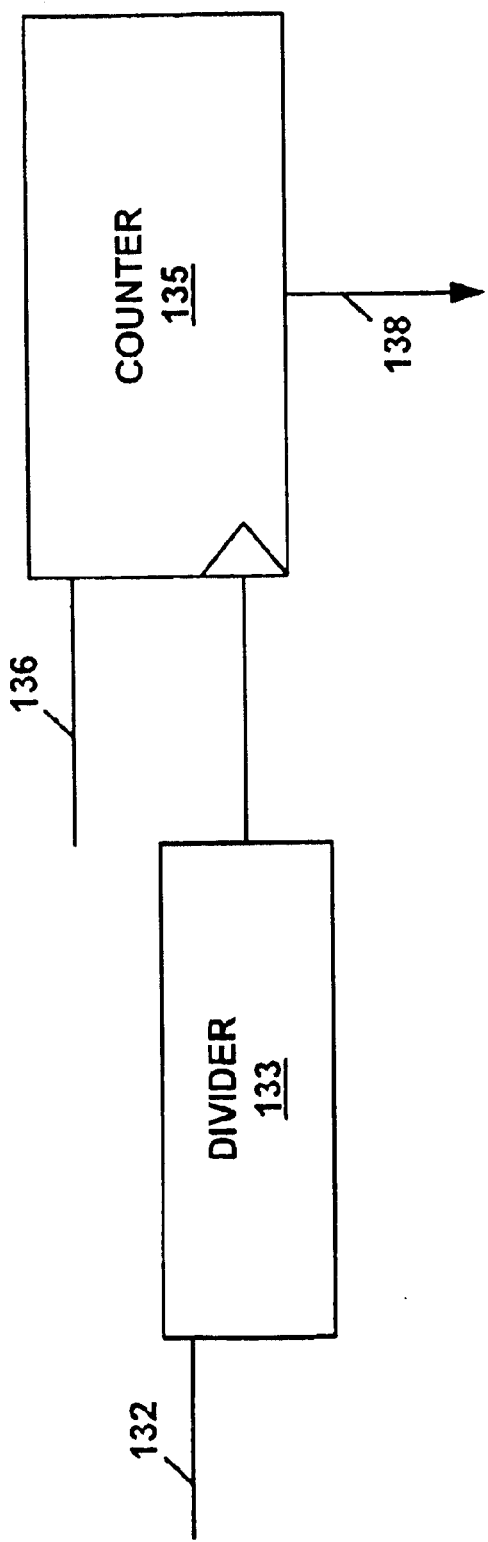
FIG. 2 is a block diagram of a signal measurement unit in accordance with an embodiment of the present invention.

FIG. 2 shows an exemplary embodiment of the test signal measurement unit 130. The signal is conditioned by running through a divider 133 having one or more flip-flops (or comparable numbers of latches). In one embodiment, the divider 133 serves to convert the test signal from a pulse to a waveform with a 50% duty cycle. In another embodiment, the divider serves to divide the frequency of test signal to a suitable level for the counter 135. The signal produced by the divider 133 increments counter 135. The counter 135 has a reset 136 that is strobed with a periodic timing signal generated from a system clock or other stable and well-defined timing signal. The counter value 138 thus represents the number of cycles in the test signal in the time of one period of the periodic timing signal. The counter value 138 is thus proportional to the frequency of the test signal.

Figure 3:
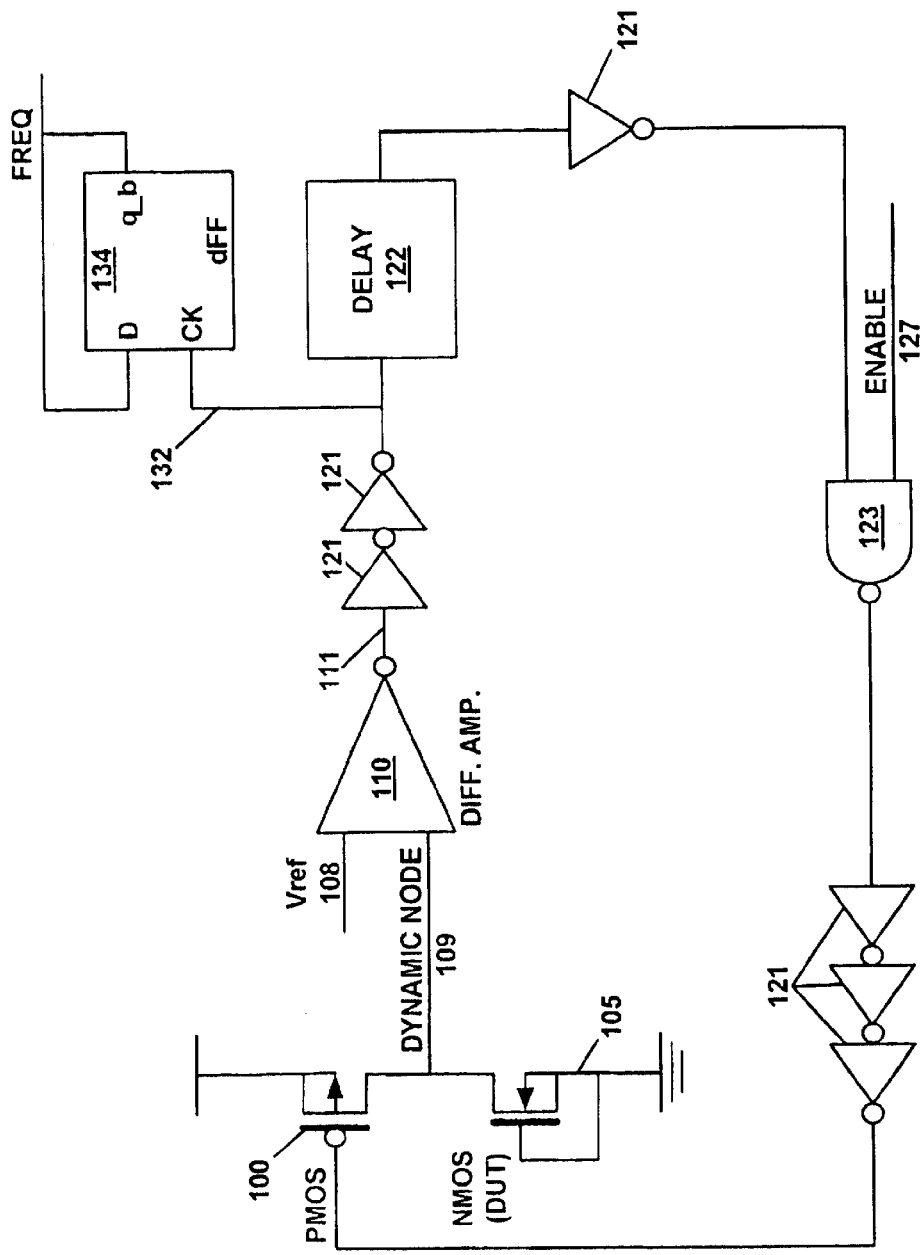
FIG. 3 is a schematic for an exemplary ring oscillator having a fundamental frequency proportional to the leakage current in a device under test in accordance with an embodiment of the present invention.

FIG. 3 shows a schematic of an exemplary embodiment of the present invention. In this embodiment, the pre-charge device 100 is a PMOS device and the leakage test device 105 is an NMOS device configured to measure transistor leakage current. The differential amplifier 110 compares the voltage of the dynamic node 109 with a reference voltage 108 (Vref). In one embodiment, $V_{ref}$ is taken to be one half of $V_{dd}$. The differential amplifier produces a signal at differential node 111. The delay unit in this embodiment is composed of a sequence of inverters 121. If desired, additional delay can be placed in supplemental delay unit 122. The delay unit in this embodiment also includes an enabling gate 123 with an enable input 127. The enable input 127 can be used to stop the ring oscillator shown from operating. The flip-flop 134 is part of the divider 133.

Figure 4:
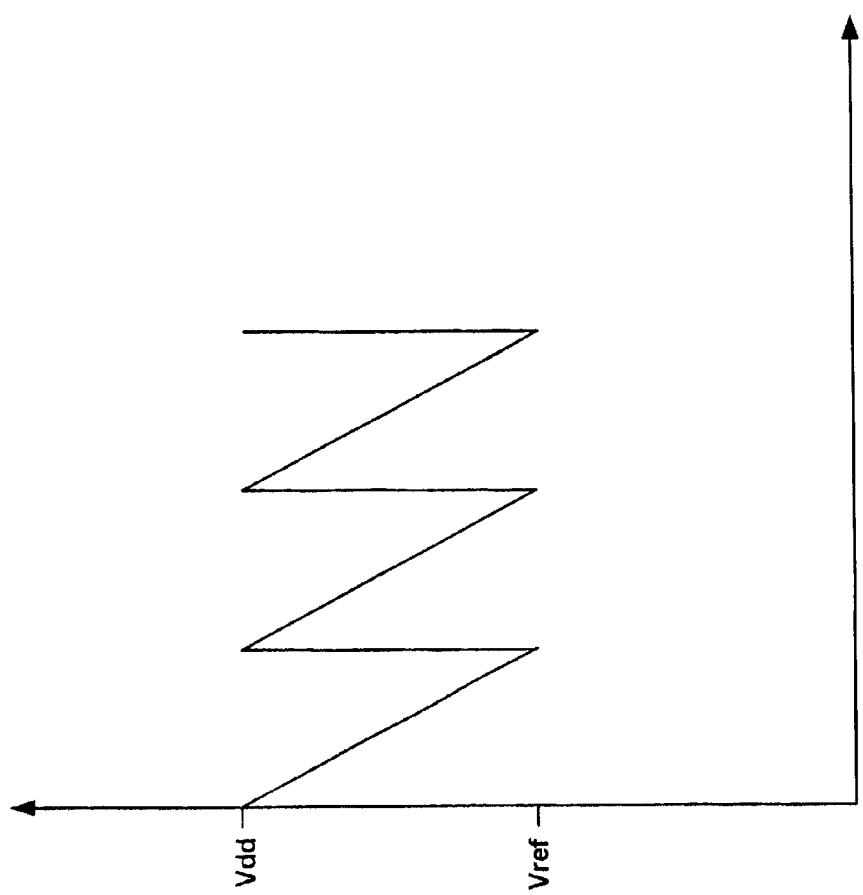
FIG. 4 is an example of a signal at the dynamic node in the schematic of FIG. 3 in accordance with an embodiment of the present invention.
Figure 5:
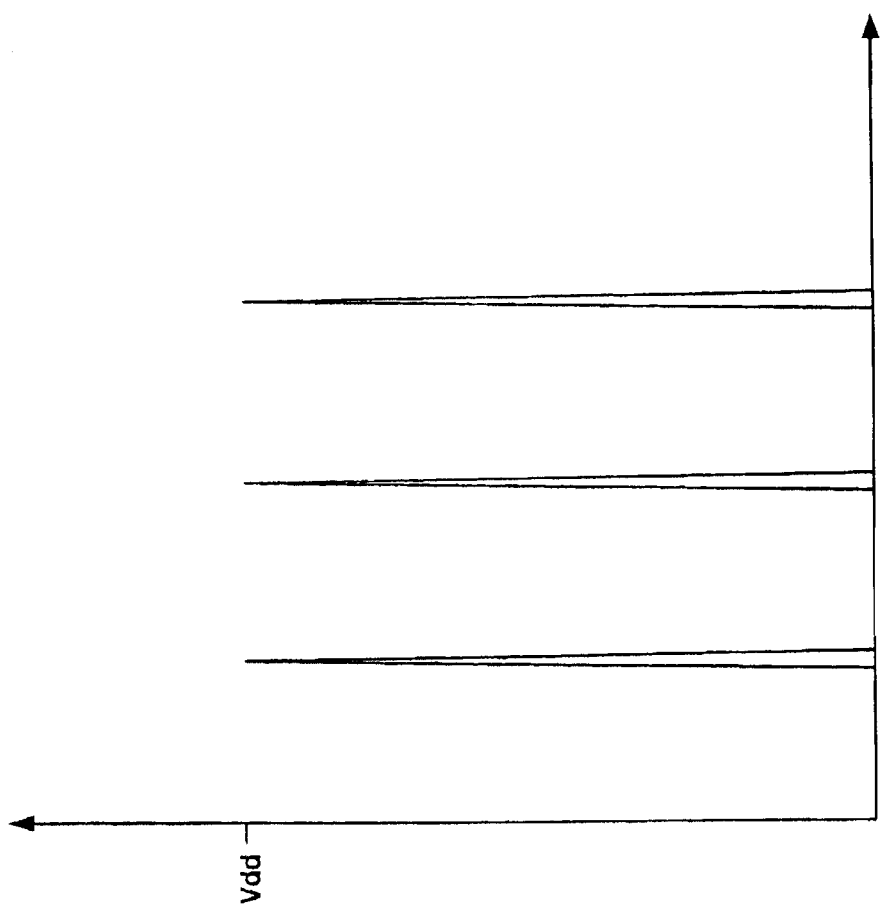
FIG. 5 is an example of a signal after processing by a differential amplifier in accordance with an embodiment of the present invention.
Figure 6:
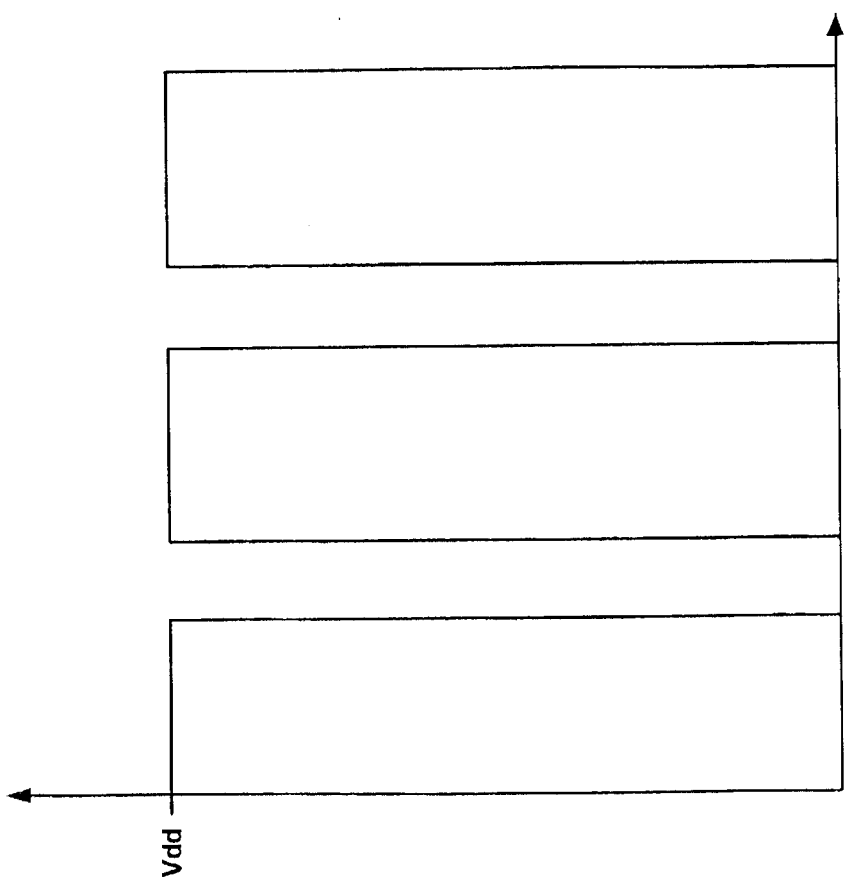
FIG. 6 is an example of a signal after passing through a flip-flop in accordance with an embodiment of the present invention.

FIGS. 4, 5 and 6 illustrate the operation of an embodiment of the present invention by showing waveforms at various nodes in the circuit as a function of time. FIG. 4 shows the voltage at the dynamic node 109. FIG. 5 shows that the result of the differential amplifier comparing the dynamic node 109 voltage to the reference voltage 108, $V_{ref}$.

The ring oscillator is initialized by setting the enable input 127 to a low value. This prevents oscillation and yet turns the pre-charge device 100 on. This drives the dynamic node 109 to a high value. When the enable input goes to a high value, the pre-charge device 100 is turned off. However, the dynamic node 109 is initially at greater value than $V_{ref}$, The differential amplifier and the delay elements with the appropriate number of inverters thus initially keeps the pre-charge device 100 turned off. Although the leakage test device 105 is biased to the off-state, it does have a leakage current that bleeds off the charge at the dynamic node 109 until the dynamic node 109 voltage reaches $V_{ref}$. At that point, the differential amplifier drives the differential node 111 to a high level that in turn activates the pre-charge device 100. The pre-charge device then quickly brings the voltage at the dynamic node 109 back to a high level that in turn switches the differential amplifier to set the differential node 111 to a low level. The process then repeats. FIG. 6 shows the result of having cleaned up the test signal by running it through a flip-flop.

In one embodiment, the average leakage current (per unit length) of a test leakage device 105 configured for transistor leakage current can be estimated with the following relationship:

$$\left[\left[I_{off} = \frac{C ? (V_{dd} - V_{ref}) ? 2^n f_t}{W}\right]\right]$$

$$I_{off} = \frac{C \cdot (V_{dd} - V_{ref}) \cdot 2^n f_t}{W}$$

where n is the number of flip-flops before initiating counting in the test signal measurement unit 130, W is the effective width of the test leakage device, C is the capacitance of the dynamic node 109, $V_{dd}$ is the supply voltage, $V_{ref}$ is the reference voltage used in the differential amplifier, and $f_t$ is the frequency measured by the test signal measurement unit 130.

In one embodiment, the average leakage current (per unit area) of a test leakage device 105 configured for gate leakage current can be estimated with the following relationship:

$$\left[\left[I_{off} = \frac{C ? (V_{dd} - V_{ref}) ? 2^n f_t}{L ? W}\right]\right]$$

$$I_{off} = \frac{C \cdot (V_{dd} - V_{ref}) \cdot 2^n f_t}{L \cdot W}$$

where n is the number of flip-flops before initiating counting in the test signal measurement unit 130, W is the effective width of the test leakage device 105, L is the effective length of the test leakage device, C is the capacitance of the dynamic node 109, $V_{dd}$ is the supply voltage, $V_{ref}$ is the reference voltage used in the differential amplifier, and $f_t$ is the frequency of the test signal measured by the test signal measurement unit 130.

These relationships assume that the delay through the differential amplifier 110 and the delay unit 120 is negligible compared to the time it takes for the leakage test device 105 to reduce the voltage at the dynamic node 109.

In another embodiment, the differential amplifier could be replaced with one or more inverters. Also note that the test signal can be obtained from any point within the ring oscillator. The total delay around the loop should be sufficient to permit the proper operation of test signal measurement unit 130.

Figure 7:
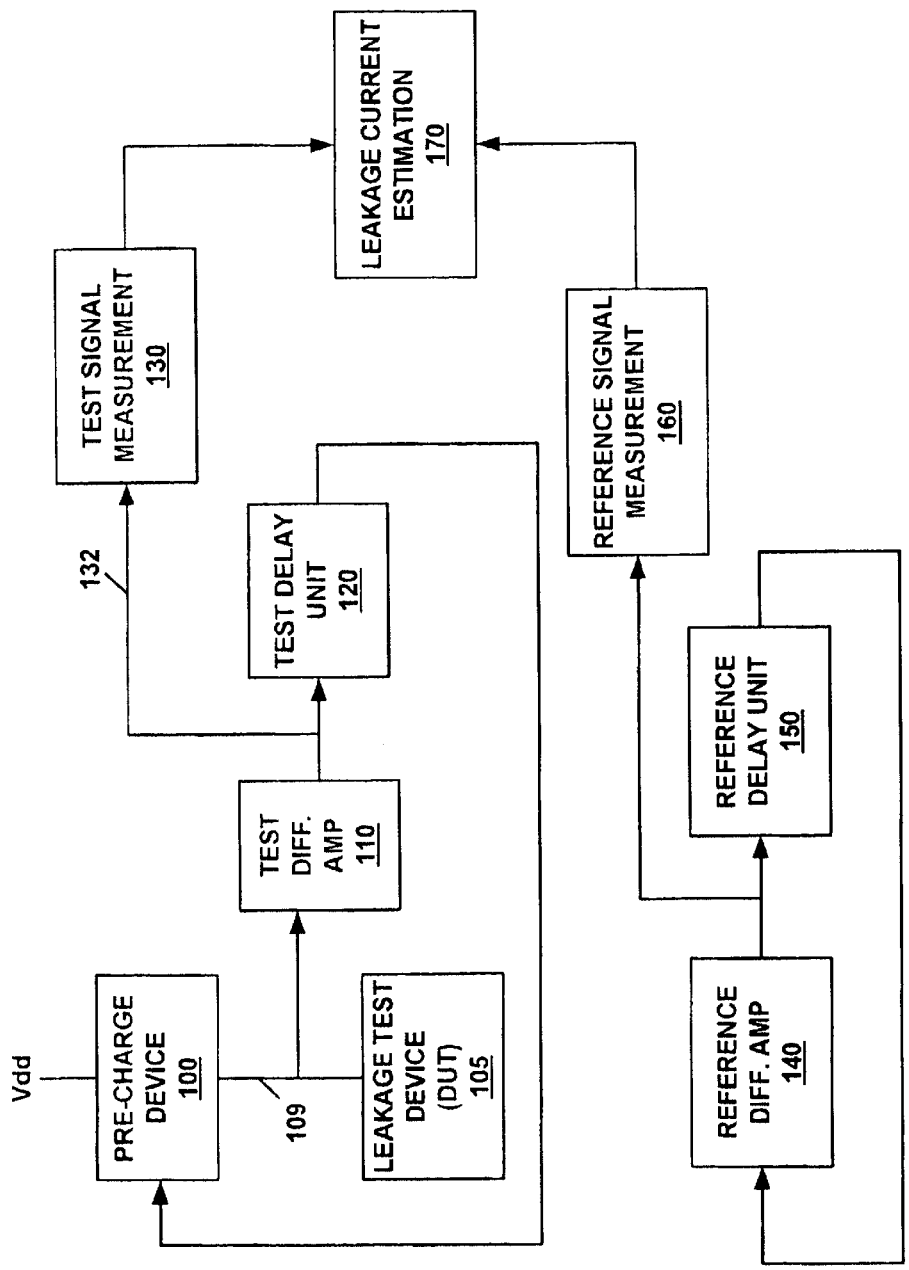
FIG. 7 is a block diagram of an exemplary leakage current measurement system using a reference circuit in accordance with an embodiment of the present invention.

In some cases the delay through the differential amplifier 110 and the delay unit 120 may be significant compared to the fall time of the dynamic node 109. FIG. 7 shows a system block diagram of an embodiment of the present invention to measure the leakage current in that situation. In addition to the parts shown in FIG. 1, FIG. 7 shows a reference ring oscillator having a reference differential amplifier 140 and a reference delay unit 150. The ring oscillator produces a reference signal with a fundamental frequency that is measured by the reference signal measurement unit 160. The reference signal measurement unit 160 can have a similar structure to the test signal measurement unit 130. The leakage current estimation unit 170 uses information about the test signal and the reference signal to compute an improved estimate of the leakage current.

Figure 8:
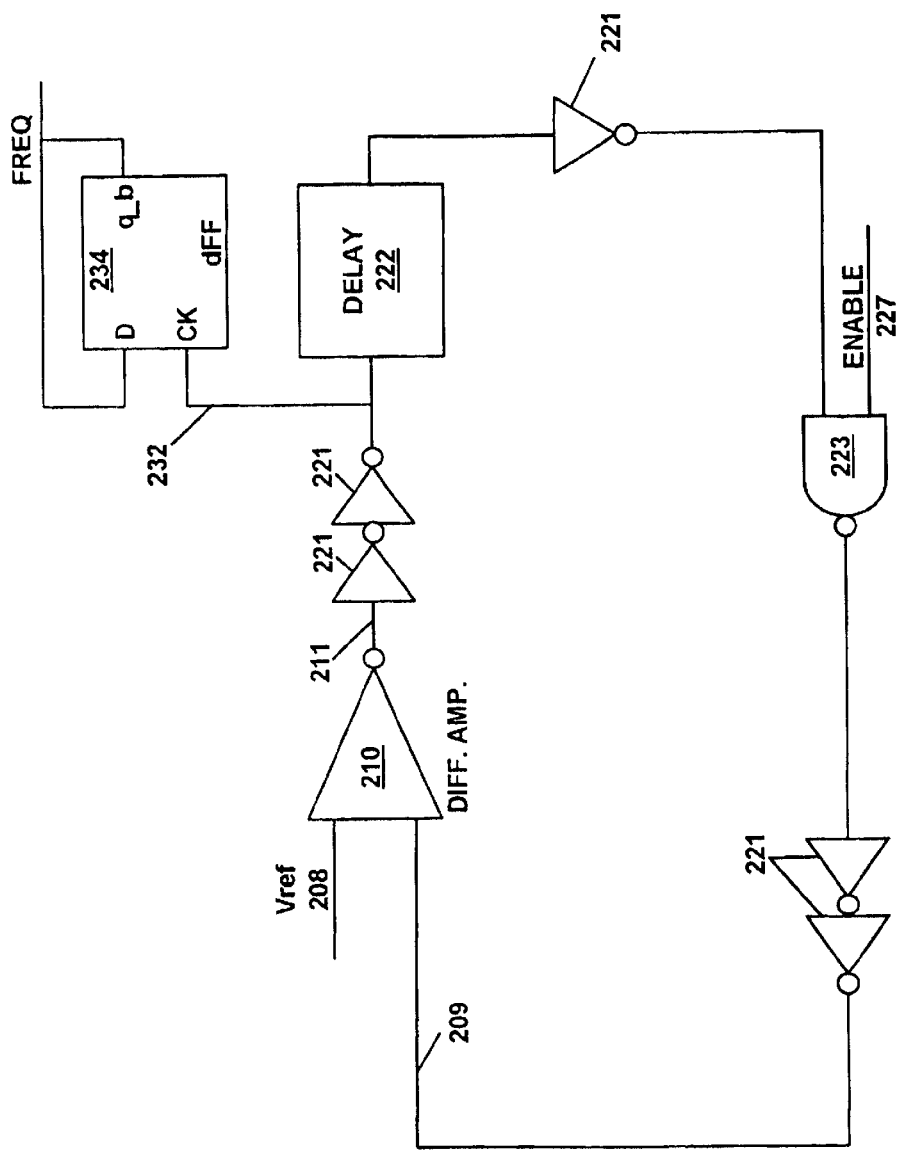
FIG. 8 is a schematic of an exemplary reference circuit in accordance with an embodiment of the present invention.

FIG. 8 shows a schematic of an embodiment of the reference oscillator in FIG. 7. In this embodiment, the reference differential amplifier 210 compares the voltage of the reference node 209 with a reference voltage 208 (Vref). In one embodiment, Vref is taken to be one half of $V_{dd}$. The differential amplifier produces a signal at differential node 211. The delay unit in this embodiment is composed of a sequence of inverters 221. If desired, additional delay can be placed in supplemental delay unit 222. The delay unit in this embodiment also includes an enabling gate 223 with an enable input 227. The enable input 227 can be used to stop the reference oscillator shown from operating. The flip-flop 234 is part of the reference signal measurement unit 160. The components of the reference oscillator should be adjusted and selected to produce a delay around the loop that is comparable to the delay found in the test differential amplifier 110 and test delay unit 120.

Figure 9:
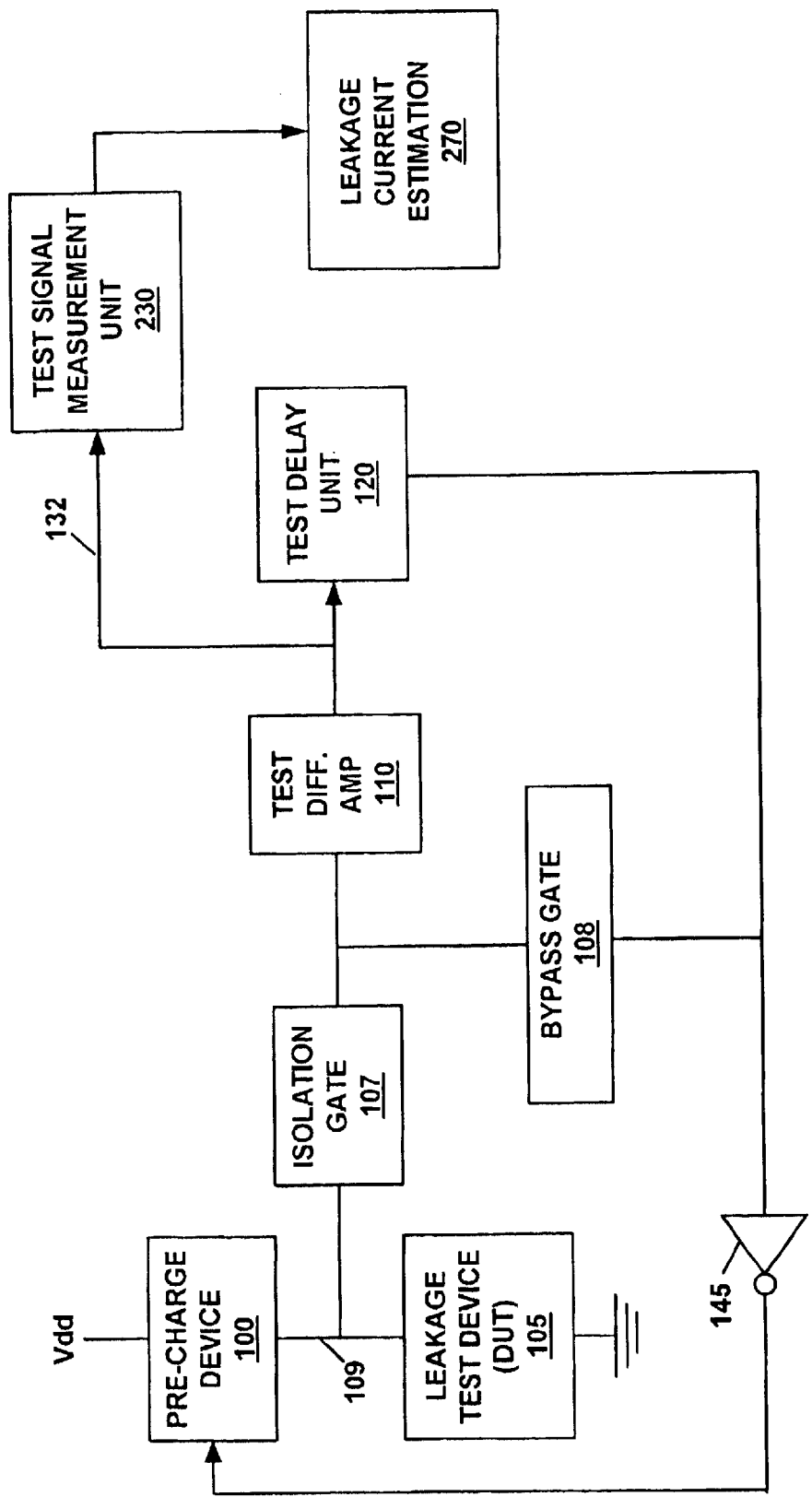
FIG. 9 is a block diagram of a leakage current measurement system that provides for multiplexing gates to use the same differential amplifier and delay unit for both reference and test measurements.

FIG. 9 shows a block diagram of an embodiment of the present invention that allows the reference oscillator and the test oscillator to share the differential amplifier and most of the delay unit. The components are the same as in the embodiment shown in FIG. 1 with the addition of isolation gate 107 and bypass gate 108. For correct operation, at least one inverter 145 should be extracted from the delay unit 120 and placed after the connection to the bypass gate 108.

To generate a test signal using the test leakage device, the isolation gate 107 is activated and the bypass gate is deactivated. In this mode, the signal measurement unit 230 measures the frequency of the test signal. To generate a reference signal, the isolation gate 107 is deactivated and the bypass gate 108 is activated, thus isolating the leakage test device 105. In this mode, the signal measurement unit 230 measures the frequency of the reference signal. The leakage current estimation unit 270 estimates the leakage current with two time-separated measurements made by the signal measurement unit 230 with the ring oscillator in different modes.

Figure 10:
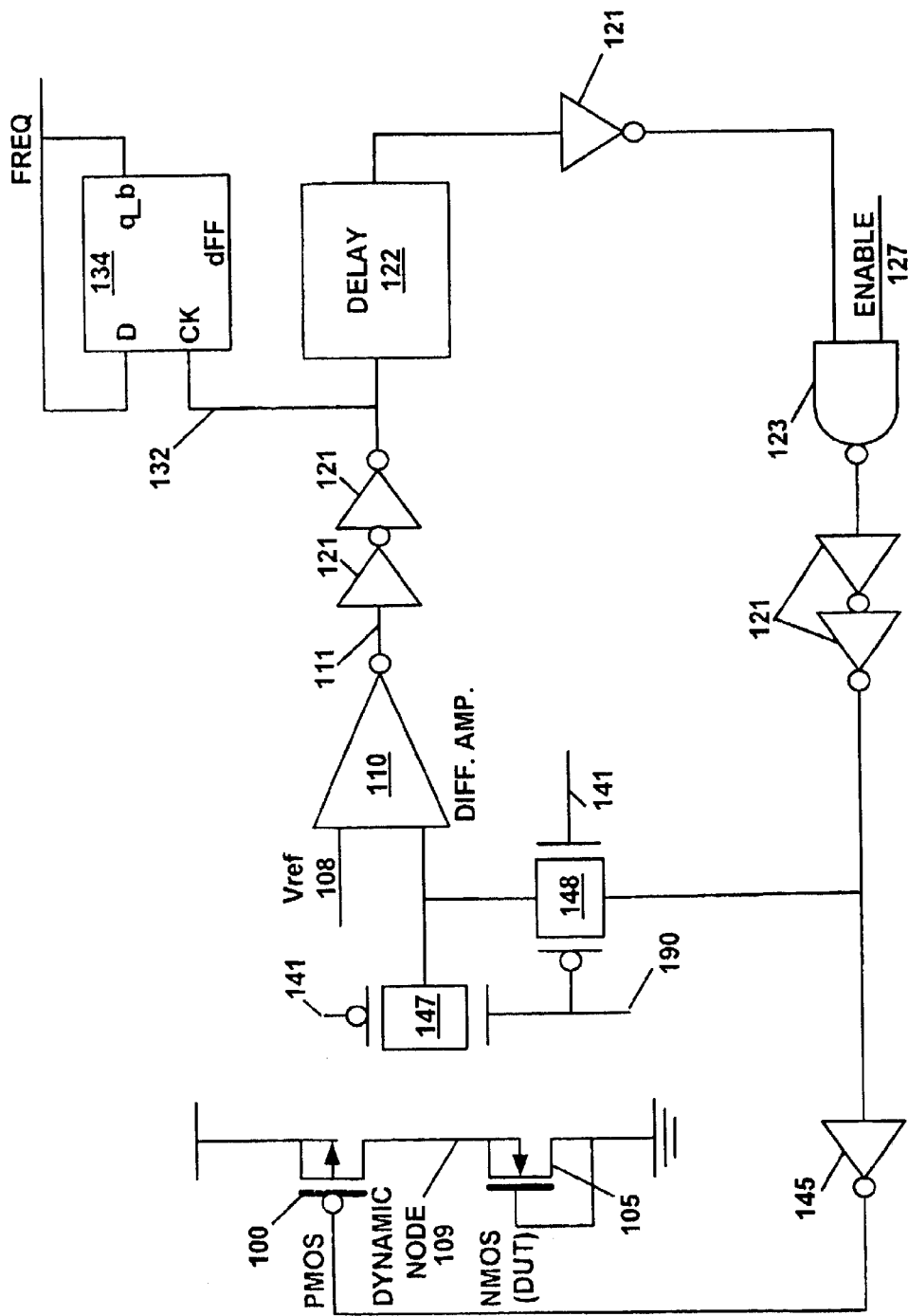
FIG. 10 is a schematic of an exemplary ring oscillator supporting a test and reference mode.

FIG. 10 is a schematic illustrating the use of a common differential amplifier 110 and delay unit 120 to generate both a reference signal and a test signal. The isolation gate 107 is implemented as a pass gate 147. The bypass gate is implemented as another pass gate 148. A test mode signal and the test mode signal negation 141 control the pass gates. To make effective measurements the transistors forming the pass gates 147, 148 should be significantly smaller than the leakage test device 105.

In one embodiment, the average leakage current (per unit length) of a test leakage device 105 configured for transistor leakage current can be estimated with the following relationship:

$$\left[\left[I_{off} = \frac{C?(V_{dd} - V_{ref})?2^n}{W?((1/f_t) - (1/f_r))}\right]\right]$$

$$I_{off} = \frac{C \cdot (V_{dd} - V_{ref}) \cdot 2^n}{W \cdot ((1/f_t) - (1/f_r))}$$

where n is the number of flip-flops before initiating counting in the test signal measurement unit 130, W is the effective width of the test leakage device, C is the capacitance of the dynamic node 109, $V_{dd}$ is the supply voltage, $V_{ref}$ is the reference voltage used in the differential amplifier, $f_t$ is the frequency measured by the test signal measurement unit 130, and $f_r$ is the frequency measured by the reference signal measurement unit 160.

In one embodiment, the average leakage current (per unit area) of a test leakage device 105 configured for gate leakage current can be estimate with the following relationship:

$$\left[\left[I_{off} = \frac{C?(V_{dd} - V_{ref})?2^n}{L?W?((1/f_t) - (1/f_r))}\right]\right]$$

$$I_{off} = \frac{C \cdot (V_{dd} - V_{ref}) \cdot 2^n}{L \cdot W \cdot ((1/f_t) - (1/f_r))}$$

where n is the number of flip-flops before initiating counting in the test signal measurement unit 130, W is the effective width of the test leakage device 105, L is the effective length of the test leakage device, C is the capacitance of the dynamic node 109, $V_{dd}$ is the supply voltage, $V_{ref}$ is the reference voltage used in the differential amplifier, $f_t$ is the frequency of the test signal measured by the test signal measurement unit 130, and $f_r$ is the frequency measured by the reference signal measurement unit 160.

Figure 11:
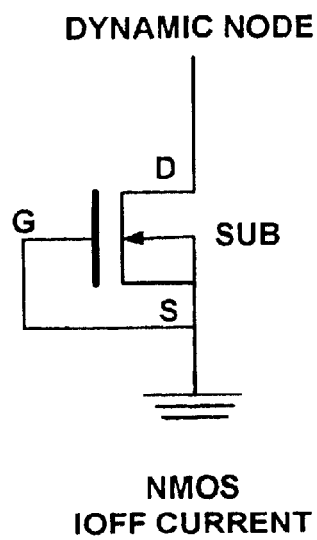
FIG. 11 is an NMOS transistor configured for use as a device under test to measure the transistor leakage current in accordance with an embodiment of the present invention.
Figure 12:
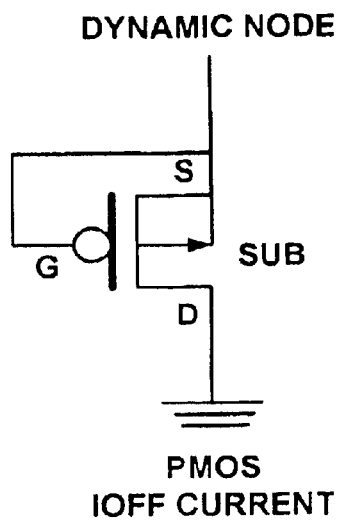
FIG. 12 is a PMOS transistor configured for use as a device under test to measure the transistor leakage current in accordance with an embodiment of the present invention.
Figure 13:
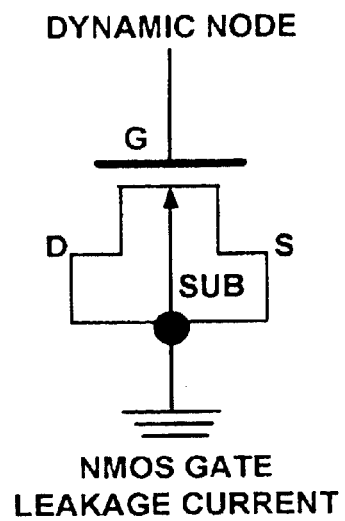
FIG. 13 is an NMOS transistor configured for use as a device under test to measure the gate leakage current in accordance with an embodiment of the present invention.
Figure 14:
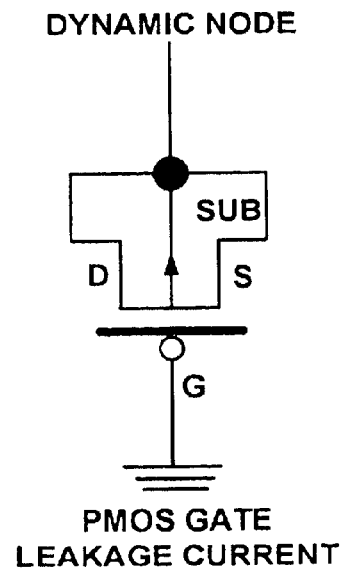
FIG. 14 is a PMOS transistor configured for use as a device under test to measure the gate leakage current in accordance with an embodiment of the present invention.

FIG. 11 shows a schematic for an NMOS leakage test device configured for measuring transistor leakage current. FIG. 12 shows a schematic for a PMOS leakage test device configured for measuring transistor leakage current FIG. 13 shows a schematic for an NMOS leakage test device configured for measuring the gate leakage current. FIG. 14 shows a schematic for a PMOS leakage test device configured for measuring gate leakage current.

Figure 15:
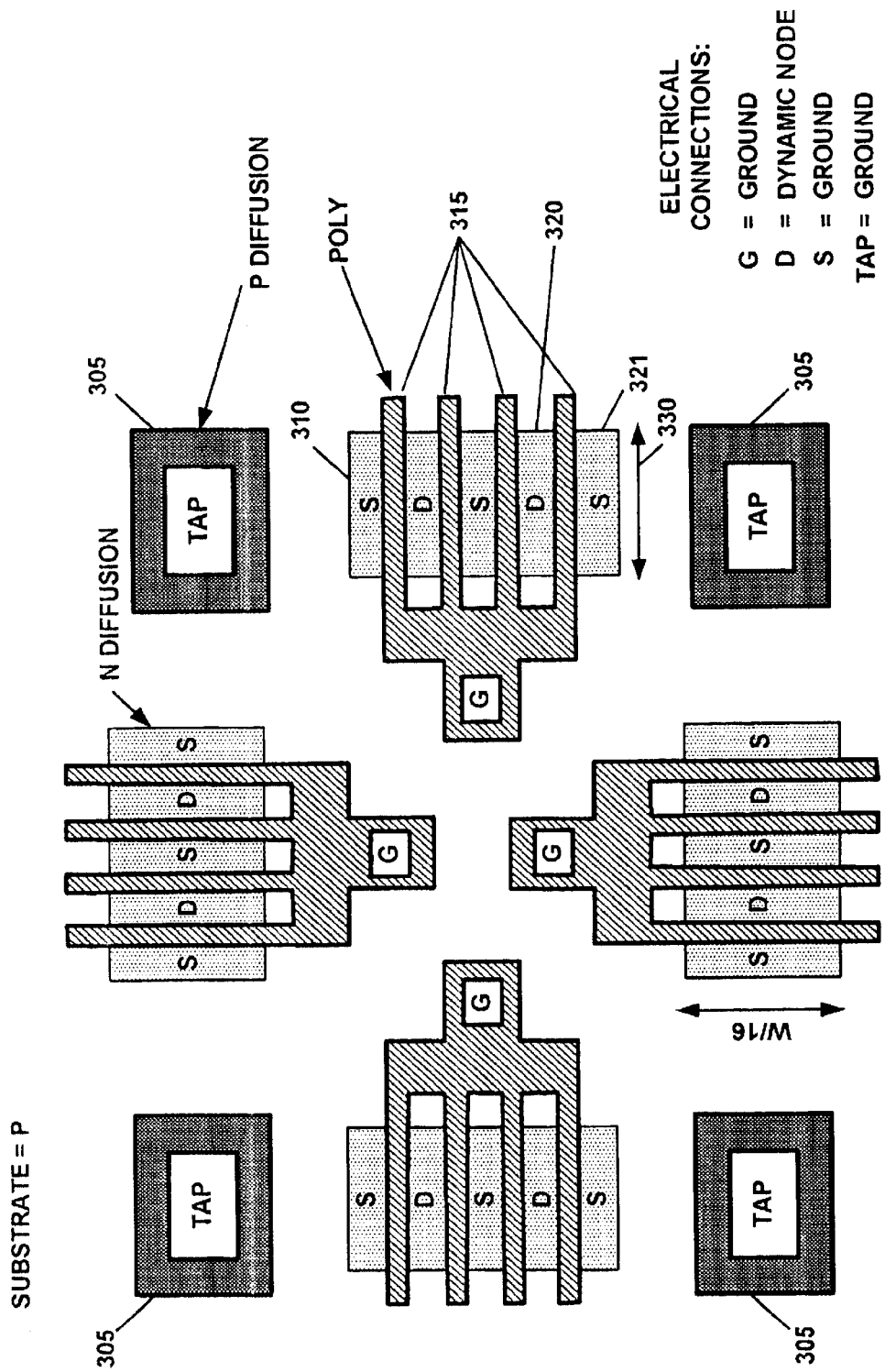
FIG. 15 is the layout of four NMOS transistors implementing the schematic of FIG. 11 in accordance with an embodiment of the present invention.

Because of non-uniformities in semi-conductor manufacturing process, the leakage current of a transistor could vary depending on its geometric orientation. In one embodiment, a leakage test device could be constructed out of several transistors with different geometric orientations. FIG. 15 shows an embodiment of a layout of several NMOS transistors orthogonally arranged implementing the schematic of FIG. 11. Four multi-fingered (or folded) transistors are shown. Each transistor is on top of the P substrate. Each transistor comprises an N-diffusion region 310 and a gate 315 formed with one or more gate fingers formed with polysilicon. The drain 320 and the source 321 are the alternating sub-regions of the N-diffusion region 310. For the leakage test device of FIG. 11, drain 320 is electrically connected to dynamic node 109. The source 321 and the gate 315 are electrically connected to ground. The P-diffusion tap 305 is also connected to ground. In an alternate embodiment, source 321 is connected to dynamic node 109 and drain 320 is connected to ground. In one embodiment, the effective width of the entire leakage test device is the number of gate fingers times the individual device width 330.

Figure 16:
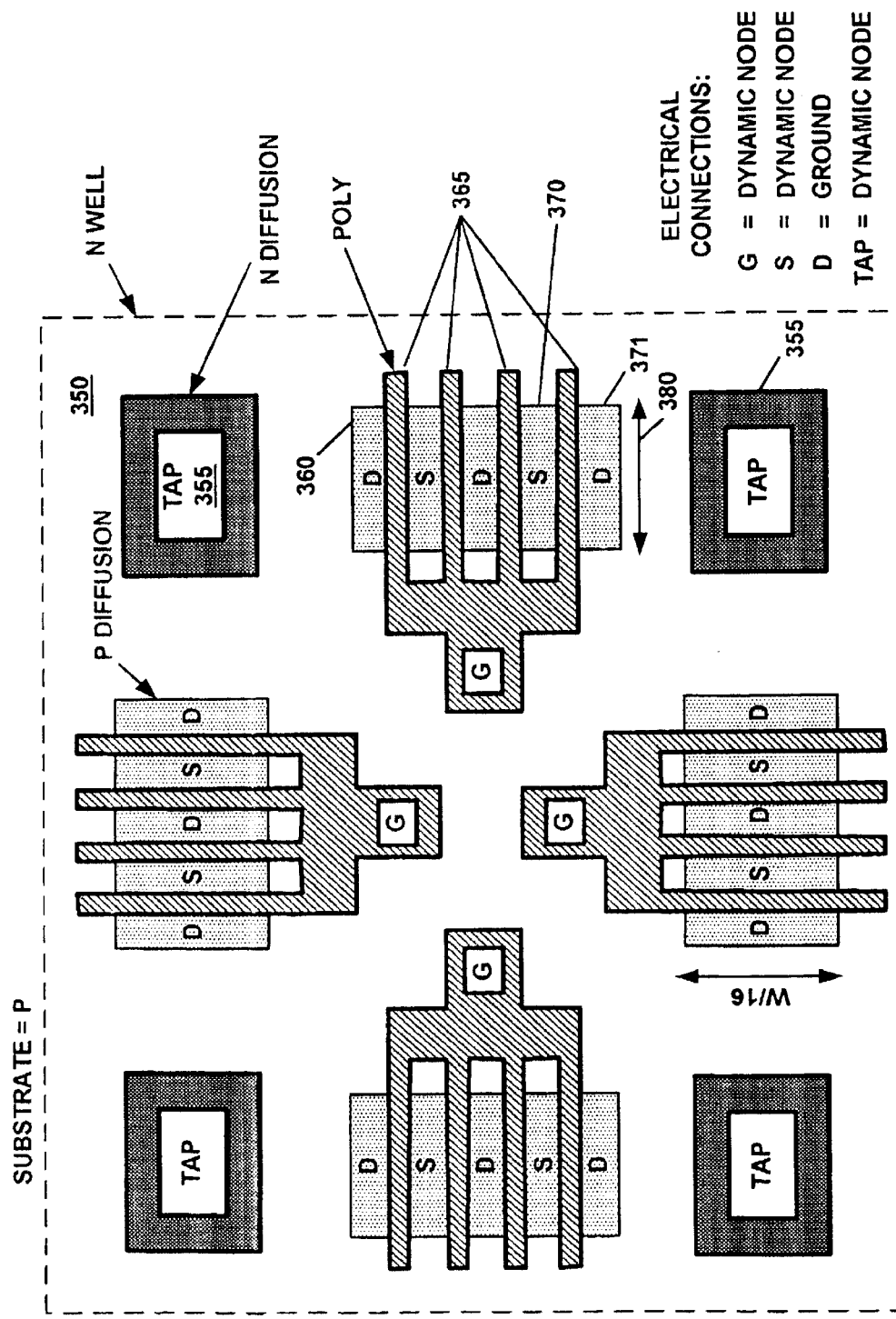
FIG. 16 is the layout of four PMOS transistors implementing the schematic of FIG. 12 in accordance with an embodiment of the present invention.

FIG. 16 shows an embodiment of a layout of several PMOS transistors orthogonally arranged implementing the schematic of FIG. 12. Four multi-fingered (or folded) transistors are shown. Each transistor is on top of an N-well 350 formed in a P substrate. Each transistor comprises a P-diffusion region 360 and a gate 365 formed with one or more gate fingers formed with polysilicon. The drain 371 and the source 370 are the alternating sub-regions of the P-diffusion region 360. For the leakage test device of FIG. 12, drain 371 is connected to ground while the source 370, the gate 365 and the N-diffusion tap 355 are connected to the dynamic node 109. In an alternate embodiment, drain 371 is connected to the dynamic node 109 while the source 370 is connected to ground. In one embodiment, the effective width of the entire leakage test device is the number of gate fingers times the individual device width 380.

Figure 17:
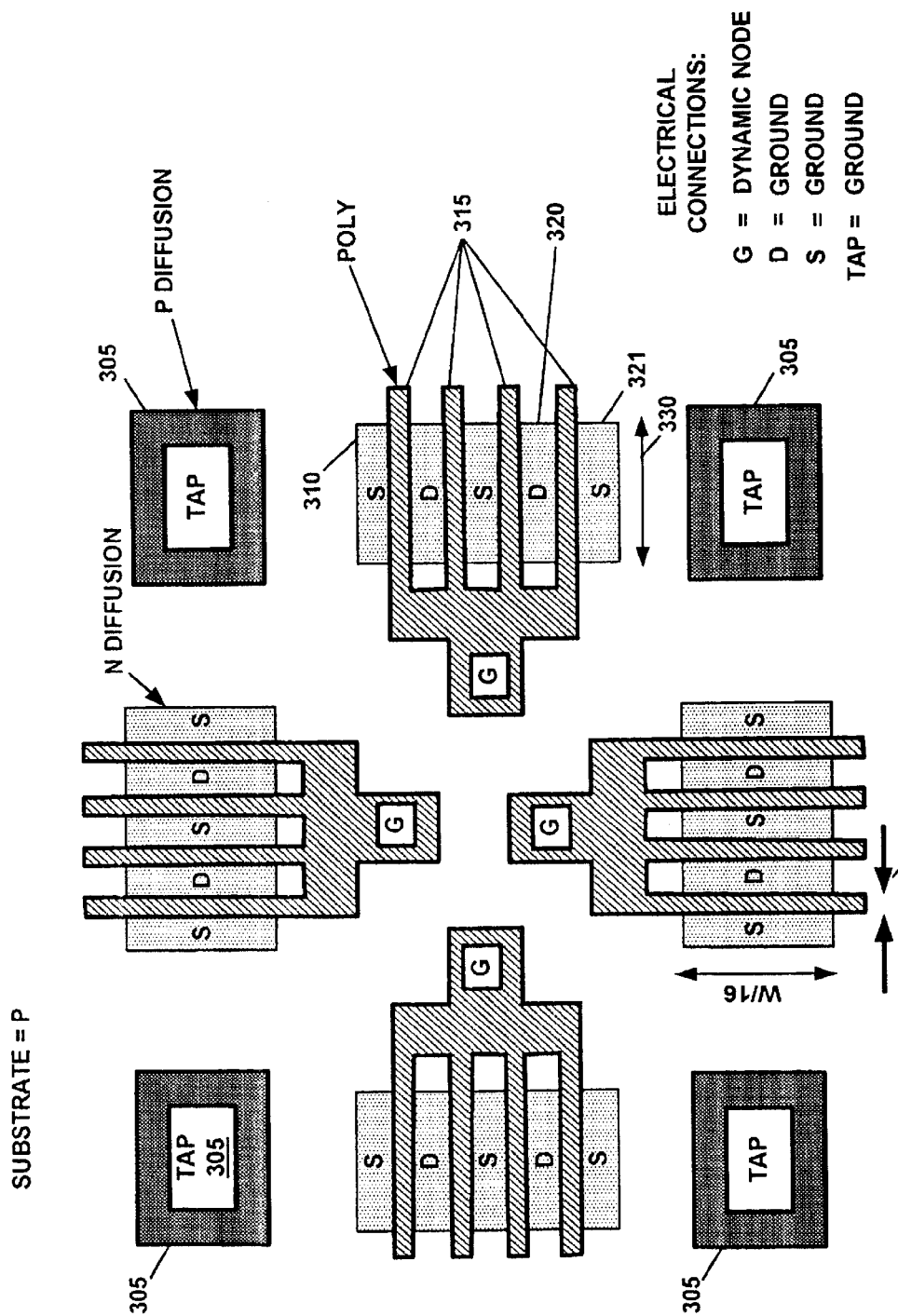
FIG. 17 is the layout of four NMOS transistors implementing the schematic of FIG. 13 in accordance with an embodiment of the present invention.

FIG. 17 shows an embodiment of a layout of several transistors orthogonally arranged implementing the schematic of FIG. 13. Four multi-fingered (or folded) transistors are shown.

Each transistor is on top of the P substrate. Each transistor comprises an N-diffusion region 310 and a gate 315 formed with one or more gate fingers formed with polysilicon. The drain 320 and the source 321 are the alternating sub regions of the N-diffusion region 310. For the leakage test device of FIG. 13, the gate 315 is electrically connected to dynamic node 109 and the drain 320, the source 321 and the P-diffusion tap 305 are electrically connected to ground. In one embodiment, the effective width of the entire leakage test device is the number of gate fingers times the individual device width 330. The effective length of the transistor is the individual gate length 335.

Figure 18:
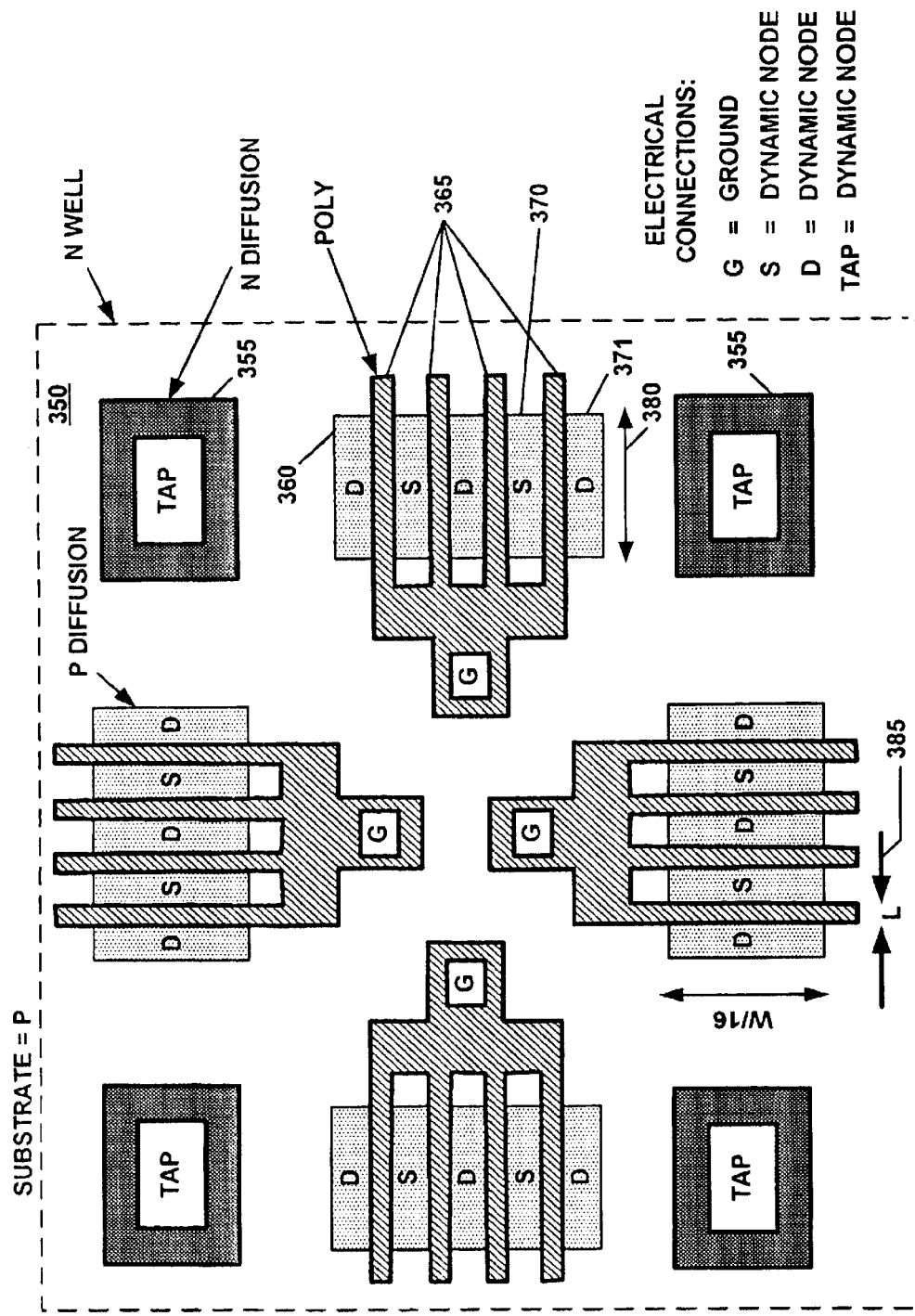
FIG. 18 is the layout of four PMOS transistors implementing the schematic of FIG. 14 in accordance with an embodiment of the present invention.

FIG. 18 shows an embodiment of a layout of several transistors orthogonally arranged implementing the schematic of FIG. 14. Four multi-fingered (or folded) transistors are shown.

Each transistor is on top of an N-well 350 formed in a P substrate. Each transistor comprises a P-diffusion region 360 and a gate 365 formed with one more gate fingers formed with polysilicon.

The drain 371 and the source 370 are the alternating subregions of the P-diffusion region 360. For the leakage test device of FIG. 14, the drain 371, the source 370 and the N-diffusion tap 355 are connected to the dynamic node 109 while the gate 365 is connected to ground. In one embodiment, the effective width of the entire leakage test device is the number of gate fingers times the individual device width 380. The effective length of the transistor is the individual gate length 385.

It should also be appreciated that the each embodiment may also be implemented in other equivalent manners without departing from the scope and spirit of the present invention.

The present invention, a system and method for measuring leakage current have thus been disclosed. Using the present invention, an accurate estimate of the leakage current associated with a particular circuit device on a particular chip is obtained. While the present invention has been described in particular embodiments, it should be appreciated that the present invention should not be construed as limited by such embodiments, but rather construed according to the below claims.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of estimating leakage current, said method comprising:

driving a ring oscillator with a dynamic node driver, said dynamic node driver comprising: a pre-charge device; and a leakage test device, said leakage test device biased to an off state with said pre-charge device coupled to said leakage test device at a dynamic node;

extracting a test signal from said ring oscillator;

measuring a test frequency from said test signal; and estimating a leakage current of said leakage test device from said test frequency.

2. The method of claim 1 wherein said ring oscillator further comprises a delay unit.

3. The method of claim 1 wherein said ring oscillator further comprises a differential amplifier.

4. The method of claim 1 wherein said measuring includes conditioning said test signal.

5. The method of claim 1 wherein said ring oscillator comprises a loop delay, and further comprising:

generating a reference signal with a reference oscillator having a comparable loop delay; and measuring a reference frequency from said reference signal.

6. The method of claim 1 wherein said leakage test device measures a transistor leakage current.

7. The method of claim 1 wherein said leakage test device measures a gate leakage current.

* * * * *